Figure 1:
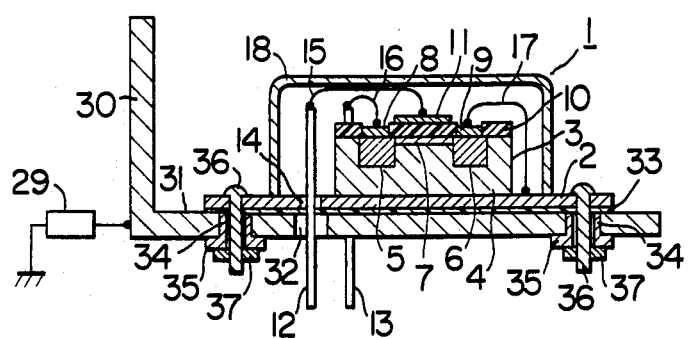

United States Patent [19]

Baba

[11] 4,151,479
[45] Apr. 24, 1979

[54] LOW FREQUENCY POWER AMPLIFIER USING MOS FET'S

[75] Inventor: Tatsuo Baba, Toyokawa, Japan
[73] Assignee: Hitachi, Ltd., Japan
[21] Appl. No.: 895,978
[22] Filed: Apr. 13, 1978
[30] Foreign Application Priority Data
  Apr. 13, 1977 [JP] Japan .................................. 52/41450
[51] Int. Cl.² .............................................. H03F 3/21
[52] U.S. Cl. ..................................... 330/264; 330/65; 330/277; 330/289
[58] Field of Search ...................... 330/65, 67, 68, 264, 330/277, 289; 307/310
[56] References Cited
  U.S. PATENT DOCUMENTS
  3,401,349  9/1968  Mitchell .............................. 330/277

Primary Examiner—James B. Mullins
Attorney, Agent, or Firm—Craig & Antonelli

[57] ABSTRACT

A low frequency power amplifier uses MOS FET's each having a semiconductor device unit including a source electrode, a drain electrode and an insulated gate electrode filled in a can type casing with the source electrode being electrically connected to the can type casing. When the MOS FET having its source electrode connected to the can type casing is mounted on a heat sink and operated in a source follower configuration, a stray capacity between the can-shaped casing and the heat sink is connected in parallel with a load so that the amplifier oscillates. The heat sink is grounded through an impedance element and the stray capacity is isolated from the load to prevent the oscillation.

7 Claims, 2 Drawing Figures

LOW FREQUENCY POWER AMPLIFIER USING MOS FET'S

The present invention relates to a low frequency power amplifier to which an audio signal is fed and which amplifies the audio signal to be supplied to a load such as a loudspeaker, and more particularly to a push-pull low frequency power amplifier which has an output push-pull stage including MOS FET's.

Many low frequency power amplifiers for amplifying an audio frequency signal reproduced from a disk record or magnetic tape use push-pull circuits including bipolar transistors. The push-pull circuit can produce a high output signal, and when it is operated in class B mode, an efficiency of power utilization is enhanced. Therefore, it is suited for use in a small-size, high-power low frequency power amplifier.

In the push-pull amplifier operated in the class B mode, push-pull operated transistors repetitively assume conductive state and non-conductive state, respectively, for each positive and negative half cycles of an input signal. Thus, a frequency characteristic of the push-pull amplifier is determined by a high frequency characteristic of the transistors which repetitively assume the conductive state and the non-conductive state. In order to attain an output characteristic which is flat up to a high frequency band, transistors having short rise time and short fall time are used.

In recent years, it has been proposed to construct a push-pull amplifier using MOS FET's which have shorter rise time and fall time than the bipolar transistors. Since the MOS FET is a device which controls majority carriers, it has a higher cutoff frequency than the bipolar transistor and hence the amplifier using the MOS FET's can provide an output characteristic which is flat up to higher frequency band than that for the amplifier using the bipolar transistors.

In fabricating the MOS FET, a substrate is formed by a monocrystalline silicon, a drain region and a source regions are formed in one plane of the substrate in a spaced relation to each other so that a conduction channel of opposite conductivity type to a conductivity type of the substrate is formed between the drain region and the source region, a gate electrode is formed above the channel while it is insulated from the substrate and the channel and it covers the channel, and a drain electrode and a source electrode are connected to the drain region and the source region, respectively, with the drain region and the source region being coupled to each other through the channel. In the MOS FET thus fabricated, a voltage is fed from an output circuit which includes a load between the drain electrode and the source electrode and an input signal is supplied across the source electrode and the gate electrode so that a current flowing in the channel is controlled by the input signal voltage to induce an amplified voltage across the load in the output circuit.

When such a MOS FET is used as a power amplifying element, a large current flows through the MOS FET so that it generates heat. Thus, like in the case of the circuit using the bipolar transistors, the circuit using the MOS FET's must be designed to dissipate the heat generated by the MOS FET's to prevent the thermal breakdown thereof. In order to effectively dissipate the heat generated by the transistor, it has been known to seal the transistor in a can type casing made of a highly thermally conductive metal. This can type casing is usually called as TO-3 casing which comprises a mounting base on which the transistor is mounted, a cover which covers the transistor and is coupled to the mounting base and a pair of electrodes mounted on the mounting base and insulated therefrom. In many cases, the MOS FET is operated in a condition in which the source electrode is coupled to the substrate and so that the source electrode and the substrate are at an equipotential. Therefore, when the MOS FET is sealed in the can type casing, the substrate of the MOS FET is mounted on the mounting base of the casing and the source electrode is electrically connected to the mounting base with the mounting base being used as the source electrode.

Furthermore, in many cases, in order to facilitate the heat dissipation, the transistor sealed in the can type casing is mounted on a heat sink made of a highly thermally conductive metal such as aluminum. Disposed between the casing and the heat sink is an electrically insulative and highly thermally conductive film such as mica so that the casing is mounted on the heat sink while it is electrically insulated from the heat sink. Consequently, there exists a stray capacity between the casing and the heat sink, which stray capacity makes the operation of the amplifier unstable.

Particularly when the heat sink is grounded and the MOS FET mounted on the heat sink is operated in a source follower configuration, the stray capacity which exists between the casing and the heat sink is connected between the source electrode and ground so that the stray capacity is connected in parallel with a load which is connected between the source electrode and ground. When the load is an inductive load such as a loudspeaker, the load and the stray capacity constitute a resonance circuit which oscillates at a specific frequency through a negative feedback circuit so that the operation of the amplifier is rendered unstable.

It is, therefore, an object of the present invention to provide a low frequency power amplifier using MOS FET's which operates in a stable manner.

It is another object of the present invention to provide a push-pull low frequency power amplifier using MOS FET's which prevents the oscillation.

The low frequency power amplifier in accordance with the present invention includes the MOS FET's to which a signal at an audio frequency is applied and which amplify the audio frequency signal. Each of the MOS FET's comprises a semiconductor device unit having a source electrode, a drain electrode and a gate electrode and a mounting base made of a highly thermally conductive material on which the semiconductor device unit is mounted and which is mounted on and insulated from a heat sink. The audio frequency signal is applied to the gate electrode and the amplified signal is taken from the source electrode, thence it is supplied to a load connected between the source electrode and ground. With such a construction, the heat sink is grounded through an impedance element such as a resistor so that a stray capacity which exists between the mounting base and the heat sink is grounded through the impedance element. Thus, the stray capacity connected in parallel with the load is connected in series with the impedance element so that an adverse effect of the stray capacity on the load is eliminated.

Figure 2:
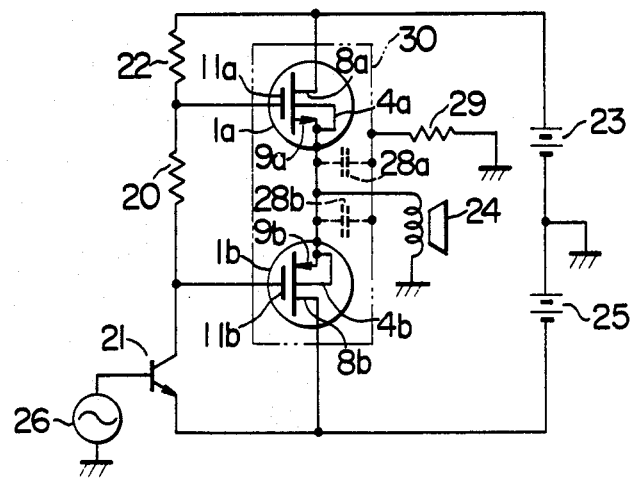

In the accompanying drawings:

FIG. 1 shows a sectional view of a MOS FET used in the low frequency power amplifier in accordance with the present invention; and FIG. 2 shows a circuit diagram illustrating one embodiment of the low frequency power amplifier in accordance with the present invention.

Referring now to FIG. 1, there is shown a schematic sectional view of a MOS FET used in the low frequency power amplifier of the present invention, in which the MOS FET 1 includes a mounting base 2 made of a highly thermally conductive material such as a copper based alloy, on which a semiconductor device unit 3 is mounted. The semiconductor device unit 3 has a substrate 4 made of a monocrystalline silicon, which is thermally and electrically coupled to the mounting base 2. On a top surface of the substrate 4, there are formed in a spaced relation to each other a drain region 5 and a source region 6 of opposite conductivity type to a conductivity type of the substrate, a channel 7 being formed between the drain region 5 and the source region 6 to couple them to each other. Electrodes 8 and 9 are connected to the tops of the drain region 5 and the source region 6, respectively, to form a drain electrode and a source electrode, respectively. An insulative layer is formed over the substrate 4 except over the drain electrode 8 and the source electrode 9, and a gate electrode 11 is formed on the insulative layer 10 to cover all or a portion of the channel 7. Two external terminals 12 and 13 are mounted on the mounting base 2 to extend therethrough and are coupled to the mounting base 2 through insulators 14 such as glass. One external terminal 12 is connected to the gate electrode 11 through a wire 15 and used as an external gate terminal while the other external terminal 13 is connected to the drain electrode 8 through a wire 16 and used as an external drain terminal. The source electrode 9 is connected to the mounting base 2 through a wire 17 and the mounting base 2 is used as a source terminal. The semiconductor device unit 3 is covered by a cover 18 which is coupled to the mounting base 2 and hermetically sealed thereby.

A circuit diagram of a low frequency power amplifier using such MOS FET's is illustrated in FIG. 2, in which an N-channel MOS FET 1a and a P-channel MOS FET 1b constitute a class B push-pull circuit. A gate electrode 11a of the first transistor 1a is connected to a collector of a drive transistor 21 through a resistor 20 and also to a positive terminal of a first D.C. voltage supply 23 through a resistor 22. A gate electrode 11b of the second transistor 1b is directly connected to the collector of the drive transistor 21. A source electrode 9a of the first transistor 1a and a source electrode 9b of the second transistor 1b are connected together and a load 24 is connected between the junction thereof and ground. A drain electrode 8a of the first transistor 1a is directly connected to the positive terminal of the first D.C. voltage supply 23 while a drain electrode 8b of the second transistor 1b is directly connected to a negative terminal of a second D.C. voltage supply 25. A substrate 4a of the first transistor 1a is connected to the source electrode 9a via the mounting base 2 shown in FIG. 1, and a substrate 4b of the second transistor 1b is connected to the source electrode 9b. The drive transistor 21 receives at its base electrode an audio frequency signal from a signal source 26, and an emitter electrode thereof is directly connected to the negative terminal of the second D.C. voltage supply 25. A negative terminal of the first D.C. voltage supply 23 and a positive terminal of the second D.C. voltage supply 25 are both grounded.

The N-channel transistor 1a and the P-channel transistor 1b operate as a complementary push-pull circuit like a bipolar transistor complementary push-pull circuit, and each transistor constitutes a source follower circuit. They are driven by an output signal voltage of the drive transistor 21 such that the first transistor 1a is rendered conductive during a positive half cycle of the output signal voltage of the drive transistor 21 while the second transistor 1b is rendered conductive during a negative half cycle. The two transistors 1a and 1b are alternately turned on and off to power the load 24.

The first transistor 1a and the second transistor 1b operate as power amplifiers respectively and large currents flow through the transistors 1a and 1b. As a result, a large amount of heat is generated from each of the transistors 1a and 1b. The heat generated from the transistors 1a and 1b is transferred to a heat sink 1 for heat dissipation. As shown in FIG. 1, the mounting base 2 of the transistor 1 is mounted on an L-shaped heat sink 30 which is made of a highly thermally conductive material such as copper or aluminum, and a base plate 31 thereof has holes 32 into which the external terminals 12 and 13 of the transistor 1 are inserted. The diameter of the hole 32 is designed to be larger than the outer diameter of the external terminal 12 or 13 to prevent the terminals 12 and 13 from contacting to the base plate 31. An insulative film 33 made of an insulative material such as mica is inserted between the base plate 31 and the mounting base 2 so that the mounting base 2 is electrically insulated from the base plate 31. The base plate 31 further has mounting holes 34 for fixing the transistor 1. Insulative washers 35 are inserted in the mounting holes 34, and bolts 36 are inserted in the washers 35 from the top of the mounting base 2. Nuts 37 are coupled to the bolts 36 from the bottom of the base plate 31. The transistor 1 is fixed to the heat sink 30 by the bolts 36 and the nuts 37 with the bolts 36 serving as the external surface terminal of the transistor 1.

The heat sink 30 is shown in FIG. 2 as dotted line block 30 encircling the two transistors 1a and 1b. Since the insulative film 33 is inserted between the mounting base 2 for the transistors 1a and 1b and the heat sink 30, there exist stray capacities 28a and 28b between the mounting base 2 and the heat sink 30. Thus, if the heat sink 30 is directly grounded, the stray capacities 28a and 28b are connected in parallel with the load 24 so that they constitute a resonance circuit together with an inductive component of the load 24. As a result, the amplifier oscillates. In the circuit shown in FIG. 2, the heat sink 30 is grounded through a resistor 29 which acts as an impedance element. As shown in FIG. 1, the source electrode of the semiconductor unit 3 is directly connected to the mounting base 2. Accordingly, the stray capacity which exists between the mounting base 2 and the heat sink 30 is connected between the source electrodes 9a and 9b and the heat sink 30. The resistor 29 connected between the heat sink 30 and ground is connected in series with the stray capacities 28a and 28b, and this series circuit is connected in parallel with the load 24. Thus, by selecting the resistance of the resistor 29 to be larger than the impedance of the load 24, the stray capacities 28a and 28b are isolated from the load 24 to prevent the oscillation of the amplifier.

When the area of the insulative film 33 is approximately 660 mm$^2$, a clamping torque of the bolt 36 is 5 kg-cm and mica is used for the insulative film, the stray capacities between the mounting base 2 for the transistor 1 and the heat sink 30 each has a capacitance of approximately 200 pF. The capacitance of each of the stray capacities 28a and 28b changes with the clamping torque of the bolt 36, but the stray capacities 28a and 28b can be isolated from the load 24 by selecting the resistance of the resistor 29 to be larger than the impedance of the load 24. In this manner, the change of the impedance of the load 24 can be prevented and the oscillation is also prevented.

An inductor or an capacitor having a larger impedance than the impedance of the load 24 may be connected, instead of the resistor 29, between the heat sink 30 and ground.

As described hereinabove, according to the invention, when the semiconductor device unit is sealed in the can type casing with the source electrode of the MOS FET being connected to the casing to constitute the source follower circuit and the can type case is mounted on the heat sink, the stray capacity which exists between the can type case and the heat sink can be isolated from the load so that the source follower circuit can be operated in a stable manner.

I claim:

1. A low frequency power amplifier circuit using a MOS FET, comprising:
   (a) a heat sink having a base plate;
   (b) a MOS FET mounted on said base plate, said MOS FET having a mounting base thermally coupled to said base plate, and a semiconductor device unit including a source electrode, a drain electrode formed in a substrate which is mounted on said mounting base and a gate electrode, said source electrode being electrically connected to said mounting base;
   (c) means for supplying an audio frequency signal to said gate electrode;
   (d) a load connected between said source electrode and ground and adapted to be powered with an amplified audio frequency signal;
   (e) a D.C. power source connected between said drain electrode and ground; and
   (f) an impedance element connected between said heat sink and ground and having a larger impedance than an impedance of said load.

2. A low frequency power amplifier using a MOS FET according to claim 1 wherein said impedance element is a resistor.

3. A low frequency power amplifier using a MOS FET according to claim 1 wherein said impedance element is an inductor.

4. A low frequency power amplifier using a MOS FET according to claim 1 wherein said impedance element is a capacitor.

5. In a low frequency power amplifier comprising:
   (a) a heat sink made of a thermally conductive material and having a base plate and a fin;
   (b) a MOS FET mounted on said base plate of said heat sink; said MOS FET having a mounting base thermally coupled to said base plate and electrically insulated therefrom and a semiconductor device unit including a source electrode and a drain electrode formed in a semiconductor substrate mounted on said mounting base and an insulated gate electrode, said source electrode being electrically connected to said mounting base;
   (c) means for supplying an audio frequency signal to said gate electrode;
   (d) a load circuit connected between said source electrode and ground; and
   (e) a D.C. power supply for supplying a current to said drain electrode;
   an improvement comprising an impedance element connected between said heat sink and ground.

6. A push-pull low frequency power amplifier using MOS FET's comprising:
   a heat sink made of a thermally conductive material and having a base plate;
   a pair of MOS FET's each mounted on said base plate and having a conduction channel of opposite conductivity type to each other;
   said pair of MOS FET's each having a mounting base thermally coupled to said base plate and a semiconductor device unit including a source electrode, a drain electrode and a gate electrode which covers said conduction channel and is insulated therefrom;
   means for supplying an audio frequency signal to the gate electrodes of said pair of MOS FET's;
   means for interconnecting the source electrodes of said pair of MOS FET's;
   a load connected between the junction of said source electrodes and ground;
   a first D.C. power supply connected between the drain electrode of one of said pair of MOS FET's and ground;
   a second D.C. power supply connected between the drain electrode of the other of said pair of MOS FET's and ground; and
   an impedance element connected between said heat sink and ground.

7. A low frequency power amplifier comprising:
   a heat sink made of a thermally conductive material and having a base plate;
   a MOS FET mounted on said base plate;
   said MOS FET having a mounting base thermally coupled to said base plate, a semiconductor device unit mounted on said mounting base and including a source electrode, a drain electrode and a gate electrode, said source electrode being electrically connected to said mounting base, and a cover fixed to said mounting base and covering said semiconductor device unit;
   an insulative film inserted between said mounting base and said base plate for electrically insulating said mounting base from said base plate;
   means for supplying an input signal to said gate electrode;
   a load circuit connected between said source electrode and ground and adapted to be powered with an amplified input signal;
   a D.C. power supply connected between said drain electrode and ground for powering said load circuit through said drain electrode and said source electrode; and
   an impedance element connected between said heat sink and ground and having a larger impedance than an impedance of said load circuit.

* * * * *